United States Patent [19]
Ohmuro

[11] Patent Number: 5,994,763
[45] Date of Patent: Nov. 30, 1999

[54] WIRING STRUCTURE FOR SEMICONDUCTOR ELEMENT AND METHOD FOR FORMING THE SAME

[75] Inventor: Kazuhiko Ohmuro, Tokyo, Japan

[73] Assignee: Oki Electric Industry Co., Ltd., Tokyo, Japan

[21] Appl. No.: 09/055,345

[22] Filed: Apr. 6, 1998

[30] Foreign Application Priority Data

Jun. 30, 1997 [JP] Japan ..................... 9-189184

[51] Int. Cl.$^6$ ................... H01L 29/40
[52] U.S. Cl. .......... 257/621; 257/663; 257/774; 257/502; 257/503; 438/620; 438/612; 438/613
[58] Field of Search .................. 257/502, 503, 257/508, 510, 513, 514, 520, 534, 599, 601, 618, 622, 621, 623, 661, 663, 698, 748, 758, 774; 438/612, 613, 614, 618, 620, 629, 637, 638, 639, 667, 666, 640

[56] References Cited

U.S. PATENT DOCUMENTS 4,286,374 9/1981 Hantusch ................... 257/623
5,037,782 8/1991 Nakamura et al. ............... 257/622

FOREIGN PATENT DOCUMENTS 58-43554 3/1983 Japan.

OTHER PUBLICATIONS

Wu, "IBM Technical Disclosure Bulletin", vol. 16 No. 9, pp. 2898–2899, Feb. 1974.

Primary Examiner—Tom Thomas
Assistant Examiner—Luan Thai
Attorney, Agent, or Firm—Jones Volentine, LLP

[57] ABSTRACT

A wiring groove 5 and a via-hole 7 (9) is formed on the backside surface 3 of a semiconductor chip 1. A circuit electrode ER led from the circuit formed on the chip 1 and a boding pad BP, both of which are formed on the front surface of the semiconductor element, are electrically connected with each other with the help of a backside wiring formed in the wiring groove 5 and a penetration wiring 13 formed in the via-hole 7 (9). With such a wiring structure, it is made possible to form a wiring pattern using the wire having an adequate width, without increasing the size of the semiconductor chip 1.

12 Claims, 7 Drawing Sheets

WIRING STRUCTURE FOR SEMICONDUCTOR ELEMENT AND METHOD FOR FORMING THE SAME

BACKGROUND OF THE INVENTION

This invention relates to a wiring structure for a semiconductor element, more particularly to a wiring structure used for forming an electric circuit such as an integrated circuit on a semiconductor chip, and the invention further relates to a method for forming such a wiring structure.

Figure 15:
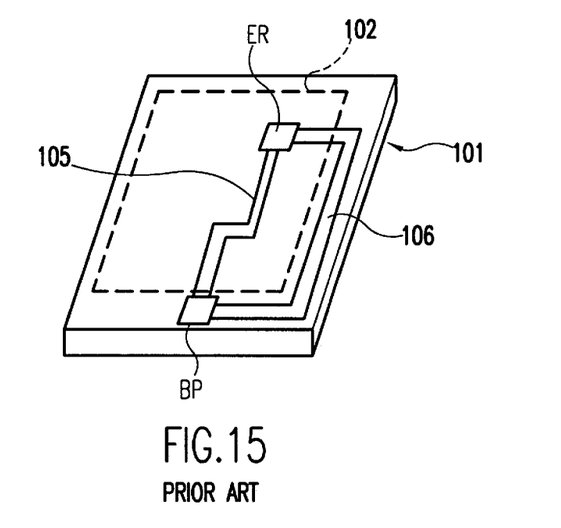
FIG. 15 is a perspective view showing an external appearance of a semiconductor element having a prior art wiring structure.

FIG. 15 illustrates an example of a semiconductor chip 101 including an exemplary wiring structure which is formed by way of a prior art wiring method. As shown in the figure, the semiconductor chip 101 includes an electrode ER which is led from the circuit formed on the chip (for simplification, referred to as 'circuit electrode ER' hereinafter), which is formed inside the circuit formation area 102 according to a predetermined process. The chip 101 also includes a bonding pad BP for wire bonding which is formed in the peripheral area of the circuit formation area 102. This bonding pad BP act as a junction point which electrically connects the internal chip circuit with an external circuit.

In the semiconductor chip 101 described in the above, the circuit electrode ER and the bonding pad BP have been generally connected with each other through a wiring pattern 105 which is formed within the circuit formation area 102, or through a wiring pattern 106 formed outside the same.

OBJECTS AND SUMMARY OF THE INVENTION

However, it sometimes happens depending on a certain circuit design that the circuit electrode ER and the bonding pad BP could not be allowed to be formed near to each other. In such a case, as the distance therebetween can not help being increased, the width of the wire forming wiring patterns 105, 106 has to be increased to compensate the elongated distance in order to reduce the electrical resistance thereof and to ensure an adequate allowable current capacity.

On the other hand, however, as the wiring patterns 105 arranged within the circuit formation area 102 have to be sufficiently insulated from each other, it is not permitted for the wire width to be enlarged without placing any limitation, even if so desired in view of the electrical resistance and allowable current capacity of the wire. In order to solve the above contradictory problem, it might be possible to utilize an external path like a wiring pattern 106 provided outside the circuit formation area 102. This might permit the wire to have an enough width. However, this naturally causes increase in the size of the semiconductor chip 101.

Hence the invention has been made in consideration of the above-mentioned problems accompanying the prior art wiring structure for a semiconductor element as mentioned above. Accordingly, an object of the invention is to provide a wiring structure formed on the semiconductor chip, according to which a wiring pattern can be designed and formed with a wire having an enough width to reduce the electrical resistance of the wire and to increase the allowable current capacity of the same. Another object of the invention is to provide a method enabling such a wiring structure to be on the semiconductor chip.

In order to solve the above-mentioned problems, according to the first aspect of the invention, there is provided a wiring structure for a semiconductor element in which a circuit electrode is electrically connected with a bonding pad, both being formed on the front surface of the semiconductor chip. This wiring structure includes a wiring groove which is formed on the backside surface of the semiconductor chip; a backside wiring which is formed on the bottom of the wiring groove; a via-hole which is formed to penetrate through both the front surface of the semiconductor chip and the bottom of the wiring groove; and a penetration wiring which electrically connects the circuit electrode with the bonding pad through the backside wiring and the via-hole.

With the wiring structure as constituted in the above, it is not always needed for the semiconductor chip to have all the necessary wirings on its front surface, and it can carry a part of the wiring on its backside surface, so that the semiconductor chip can reduce its size for containing all the necessary wirings. Furthermore, as the backside wiring is formed on the bottom of the wiring groove, it can be effectively isolated from other backside electrodes such as a ground electrode formed on the backside surface of the semiconductor chip.

The cross section (e.g. taken on line a-a' of FIG. 1) of the wiring groove shows a shape of a truncated cone, of which the opening is gradually enlarged as it goes on from the backside surface of the semiconductor chip to the inside thereof. With this structure of the wiring groove, when a conductive material is deposited by using a method of evaporation or sputtering from the backside of the semiconductor chip in order to form the backside wiring in the wiring groove, the conductive material is deposited only on its bottom but is not on the side of the wiring groove. Accordingly, the backside electrode and the backside wiring can be simultaneously formed respectively on the backside surface of the semiconductor chip and on the bottom of the wiring groove.

If the wiring groove is formed in such a manner that its bottom makes an angle of larger than 90° with respect to the side face of the via-hole on which the penetration wiring is disposed, the backside wiring and the penetration wiring can be simultaneously formed respectively on the bottom of the wiring groove and in the via-hole.

Furthermore, at least the externally exposed portion of the backside wiring formed in the wiring groove and the same of the penetration wiring passing through the via-hole are may be covered by an insulating material, thereby enabling the backside wiring and the penetration wiring to be well insulated from the backside electrode such as a ground electrode.

The via-hole may be formed in the area for forming the circuit electrode and/or the bonding pad on the front surface of the semiconductor chip. With this arrangement, connection between the backside wiring and the circuit electrode and/or bonding pad can be simply achieved by forming the via-hole and then forming the penetration wiring on the side of the via-hole, thus enabling a wiring structure to occupy a smaller area on the semiconductor chip.

According to the second aspect of the invention, there is provided a method for forming a wire structure for a semiconductor element, by which a circuit electrode and a bonding pad are electrically connected with each other, both being formed on the front surface of the semiconductor element. This method includes the steps of: forming a backside electrode in an area on the backside surface of the semiconductor chip, the area being different from the areas reserved for forming a wiring groove and a via-hole; forming a via-hole in the area reserved therefor, the via-hole including an undercut portion with respect to the backside electrode; forming a wiring groove in the area reserved therefor, the wiring groove including an undercut portion with respect to the backside electrode; and depositing a conductive material on the backside surface of the semiconductor chip in the direction in parallel with the normal line thereto.

According to the above-mentioned method, it becomes possible to reduce the area occupied by the wiring formed on the semiconductor chip and also to produce the backside wiring well isolated from the backside electrode with a small number of processes. Furthermore, as the undercut portion functions as a mask in the process of depositing the conductive material, it is not required to provide any mask afresh and deposition of the conductive material onto unnecessary portion can be avoided.

In addition, according to the third aspect of the invention, there is provided a method for forming a wire structure for a semiconductor element, by which a circuit electrode and a bonding pad are electrically connected with each other, both being formed on the front surface of the semiconductor element. The method includes the steps of: forming a via-hole in the area reserved therefor on the backside surface of the semiconductor chip, in such a manner that the via-hole has a cross section (e.g. taken on line b-b' of FIG. 1) in the shape of a truncated cone inverted upside down, of which the opening is gradually made narrower as it goes on from the backside surface of the semiconductor chip to the inside thereof; forming a wiring groove in the area reserved therefor, in such a manner that the wiring groove has a cross section in the shape of a truncated cone, of which the opening is gradually enlarged as it goes on from the backside surface of the semiconductor chip to the inside thereof, and at the same time, carrying out reformation of the previously formed via-hole excluding the side thereof on which the penetration wiring is to be formed, in such a manner the it has a cross section in the shape of a truncated cone, of which the opening is gradually enlarged until it enters in the semiconductor chip by a predetermined depth; and depositing a conductive material on the backside surface of the semiconductor chip in parallel with the normal line thereto.

According to this method, the backside wiring, the penetration wiring, and the backside electrode can be formed all at once, so that the number of processes can be further reduced.

The via-hole may be formed in the area for forming the circuit electrode and/or the bonding pad on the front surface of the semiconductor chip. With this arrangement, connection between the backside wiring and the circuit electrode and/or bonding pad can be simply achieved by forming the via-hole and then forming the penetration wiring on the side of the via-hole, thus enabling a wiring structure to be formed so as to occupy a smaller area on the semiconductor chip.

With this arrangement, connection between the backside wiring and the circuit electrode and/or bonding pad can be simply achieved by forming the via-hole and then forming the penetration wiring on the side face of the via-hole, so that it is unnecessary to carry out any additional process in order to connect the penetration wiring with the circuit electrode and/or bonding pad.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings:

FIG. 2 shows two sectional views of a wiring structure according to the first embodiment of the invention, FIG. 2(a) being a sectional view taken on line a-a' of FIG. 1, and FIG. 2(b) being a sectional view taken on line b-b' of FIG. 1;

FIG. 3 shows two sectional views of a wiring structure in the first process of forming the wire structure as shown in FIG. 2, FIG. 3(a) being a sectional view taken on line a-a' of FIG. 1, and FIG. 3(b) being a sectional view taken on line b-b' of FIG. 1;

FIG. 4 shows two sectional views of a wiring structure in the second process of forming the wire structure as shown in FIG. 2, FIG. 4(a) being a sectional view taken on line a-a of FIG. 1, and FIG. 4(b) being a sectional view taken on line b-b' of FIG. 1;

FIG. 5 shows two sectional views of a wiring structure in the third process of forming the wire structure as shown in FIG. 2, FIG. 5(a) being a sectional view taken on line a-a' of FIG. 1, and FIG. 5(b) being a sectional view taken on line b-b' of FIG. 1;

FIG. 6 shows two sectional views of a wiring structure in the fourth process of forming the wire structure as shown in FIG. 2, FIG. 6(a) being a sectional view taken on line a-a' of FIG. 1, and FIG. 6(b) being a sectional view taken on line b-b' of FIG. 1;

FIG. 7 shows two sectional views of a wiring structure in the fifth process of forming the wire structure as shown in FIG. 2, FIG. 7(a) being a sectional view taken on line a-a' of FIG. 1, and FIG. 7(b) being a sectional view taken on line b-b' of FIG. 1;

FIG. 8 shows two sectional views of a wiring structure according to the second embodiment of the invention, FIG. 8(a) being a sectional view taken on line a-a' of FIG. 1, and FIG. 8(b) being a sectional view taken on line b-b' of FIG. 1;

FIG. 9 shows two sectional views of a wiring structure in the first process of forming the wire structure as shown in FIG. 8, FIG. 9(a) being a view taken on line a-a' of FIG. 1, and FIG. 9(b) being a view taken on line b-b' of FIG. 1;

FIG. 10 shows two sectional views of a wiring structure in the second process of forming the wire structure as shown in FIG. 8, FIG. 10(a) being a view taken on line a-a' of FIG. 1, and FIG. 10(b) being a view taken on line b-b' of FIG. 1;

FIG. 11 shows two sectional views of a wiring structure in the third process of forming the wire structure as shown in FIG. 8, FIG. 11(a) being a view taken on line a-a' of FIG. 1, and FIG. 11(b) being a view taken on line b-b' of FIG. 1;

FIG. 12 shows two sectional views of a wiring structure in the fourth process of forming the wire structure as shown in FIG. 8, FIG. 12(a) being a view taken on line a-a' of FIG. 1, and FIG. 12(b) being a view taken on line b-b' of FIG. 1;

FIG. 13 shows two sectional views of a wiring structure in the fifth process of forming the wire structure as shown in FIG. 8, FIG. 13(a) being a view taken on line a-a' of FIG. 1, and FIG. 13(b) being a view taken on line b-b' of FIG. 1;

FIG. 14 shows two sectional views of a wiring structure according to the third embodiment of the invention, FIG. 14(a) being a view taken on line a-a' of FIG. 1, and FIG. 14(b) being a view taken on line b-b' of FIG. 1.

PREFERRED EMBODIMENTS OF THE INVENTION

The wiring structure in the semiconductor element and the method for forming the same according to the invention will now be described in detail in the following with reference to the accompanying drawings. In the following description, however, the constituents of the invention having almost similar function and constitution are indicated with like reference numerals in order to avoid redundancy in the description.

First Embodiment

Figure 1:
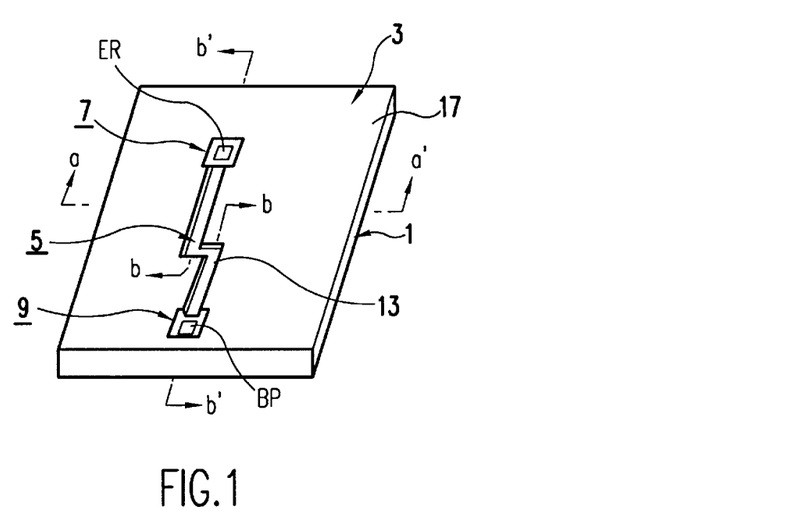
FIG. 1 is a perspective view showing an external appearance of a semiconductor chip having a wiring structure formed according to the invention.
Figure 2A:
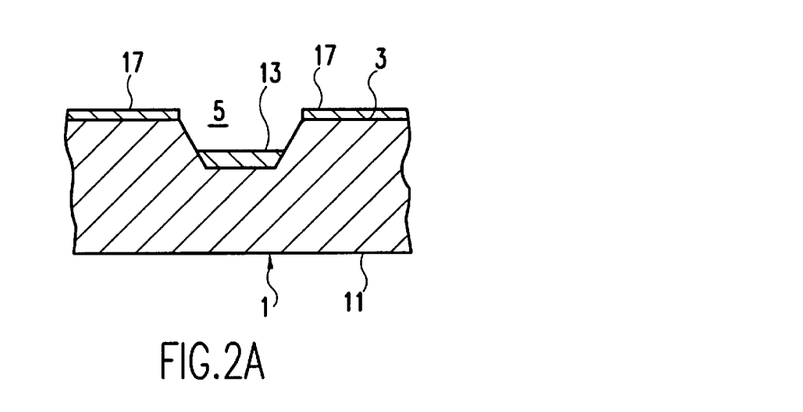
Figure 2B:
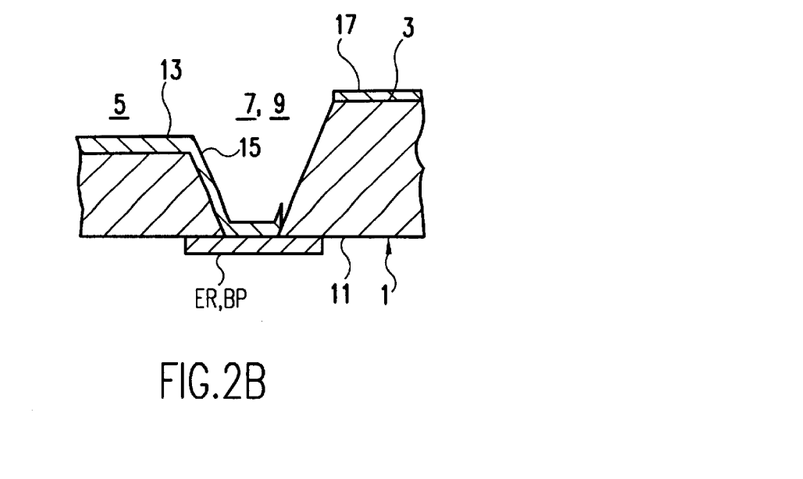

FIG. 1 is a perspective view showing an external appearance of a semiconductor chip 1 having a wiring structure, which is formed on the backside surface 3 thereof according to the first embodiment of the invention, and FIGS. 2(a) and 2(b) are sectional views taken on lines a-a' and b-b' of FIG. 1, respectively.

As shown in the figure, the backside surface 3 of the semiconductor chip 1 includes a wiring groove 5(9) which are for and via-hole 7 which are formed thereon. The wiring groove 5 is formed to have a depth to the extent that a backside wiring 13 does not come out exceeding the surface of the backside surface 3 of the chip 1 when it is formed in the bottom of the wiring groove 5. On the other hand, a via-hole 7 (9) is formed to have such a depth that it can reach the circuit electrode ER and the bonding pad BP, both being formed on the front surface 11 of the chip 1. The wiring groove 5 and the via-hole 7 (9) are formed to have a cross section in the shape of a truncated cone inverted upside down, of which the opening is gradually made narrower as it goes on from the backside surface of the chip 1 to the inside thereof.

The circuit electrode ER and the bonding pad BP formed on the front surface 11 of the semiconductor chip 1 are electrically connected with each other by the backside wiring 13 formed on the bottom of the wiring groove 5, and the penetration wirings 15 formed through the via-hole 7 (9).

In the other area of backside surface 3 which includes neither the wiring groove 5 nor the via-hole 7 (9), a ground electrode 17 is formed as a backside electrode.

Accordingly, the wiring structure as described in the above makes it possible to electrically connect the circuit electrode ER and the bonding pad BP with each other, with the help of the backside wiring 13 provided on the backside surface 3 and the penetration wirings 15 in the via-hole, thus enabling the area of the semiconductor chip 1 for wiring to be substantially reduced.

Furthermore, as the backside wiring 13 is formed on the bottom of the wiring groove 5 having a predetermined depth, it can be sufficiently insulated from the ground electrode 17 formed on the backside surface 3 of the semiconductor chip 1. Also, as the width of the wire used as the backside wiring 13 can be increased, if needed, by expanding the width of the wiring groove 5, the allowable current capacity between the circuit electrode ER and the bonding pad BP can be controlled with ease.

The method for forming the wiring structure as mentioned in the above will now be described with reference to FIGS. 3(a) through 7(b). In these figures, FIGS. 3(a), 4(a), 5(a), 6(a), and 7(a) are sectional views taken on line a-a' of FIG. 1, respectively, while FIGS. 3(b), 4(b), 5(b), 6(b), and 7 (b) are sectional views taken on line b-b' of FIG. 1, respectively.

Figure 3A:
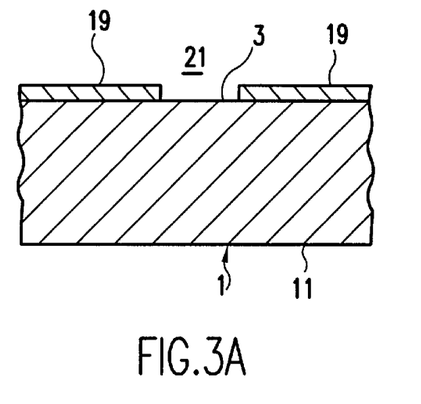
Figure 3B:
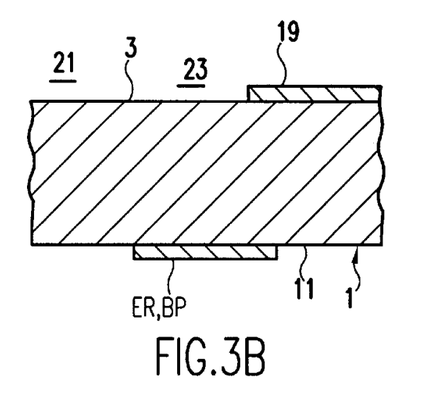

First Process—FIGS. 3(a), 3(b)

A conductive film 19 is deposited on the backside surface 3 of the semiconductor chip 1 except predetermined areas, for instance an area 21 reserved for formation of the wiring groove 5, and an area 23 reserved for formation of the via-hole 7 (9). This film 19 will be finished as the ground electrode 17 in the later process eventually. Thus, the deposited film 19 has such a pattern that the predetermined areas as mentioned above are removed therefrom. Alternatively, this conductive film 19 may be formed by initially depositing it on the backside surface 3 of the semiconductor chip 1 to cover the entire surface thereof and then removing predetermined areas such as areas 21, 23 by means of etching or by other methods e.g. the lift-off method.

Figure 4A:
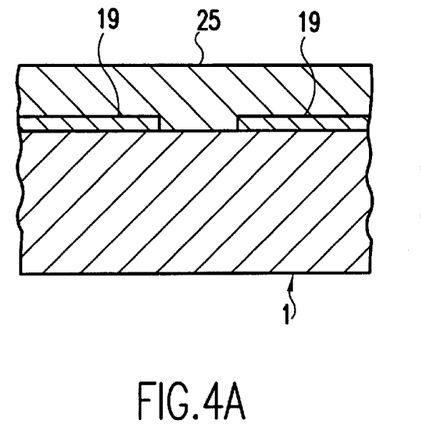
Figure 4B:
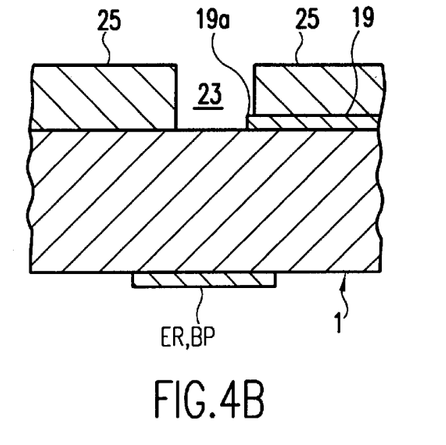

Second Process—FIGS. 4(a), 4(b)

A resist film 25 is applied to cover the backside surface 3 with the conductive film 19 deposited thereon, but not to cover the area 23 reserved for formation of via-holes, thereby leaving an opening therefor in the resist film 25. In this case, the opening of the resist film 25 is to be adjusted in such a manner that its inside wall coincides with the edge 19(a) of the conductive film 19 or the edge 19(a) projects a very little inside the opening as shown in FIG. 4(b), even if no coincidence were achieved.

Figure 5A:
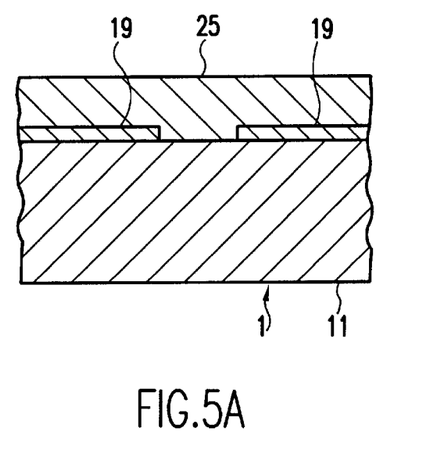
Figure 5B:
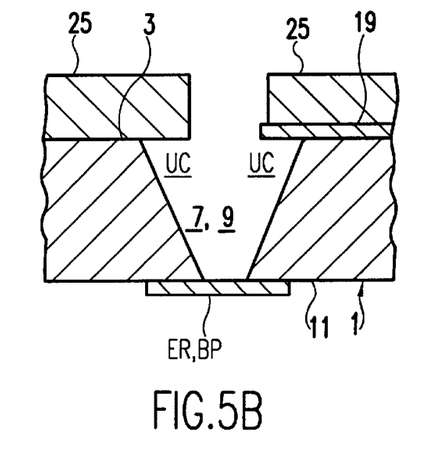

Third Process—FIGS. 5(a), 5(b)

Etching is performed through the opening of the resist film 25 to remove in part the semiconductor chip 1 toward the front surface 11 thereof, thereby forming via-hole 7 (9). The formation of via-hole 7 (9) is controlled in such a manner that the via-hole opening is gradually made smaller as the etching progresses from the backside surface 3 of the chip 1 toward the front surface 11 thereof. Via-hole 7 (9) are etched until they reach the circuit electrode ER and the bonding pad BP which are formed on the front surface 11 of the chip 1, and at the same time, the undercut (side etching) UC laterally progresses under the resist film 25 and the conductive film 19 as well.

Figure 6A:
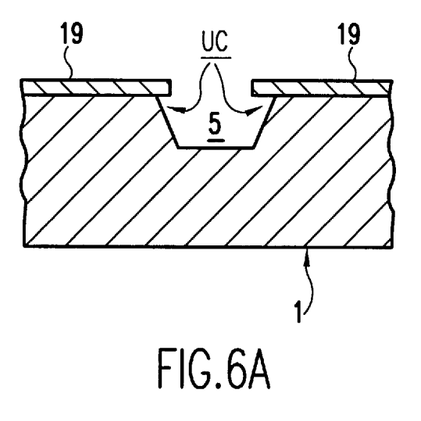
Figure 6B:
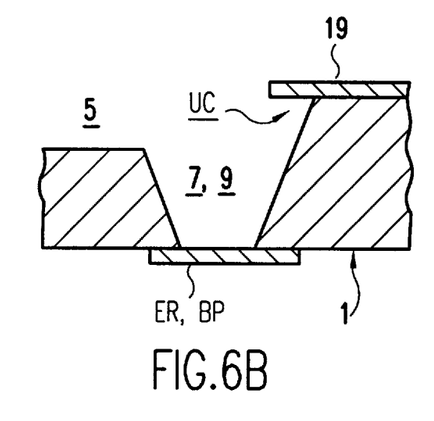

Fourth Process—FIGS. 6(a), 6(b)

The resist film 25 formed in the second process is removed at this stage. Then, further etching is performed to form the wiring groove 5 having a predetermined depth. In this etching process, the conductive film 19 formed in the first process acts as a mask. In this case, etching is isotropic so that the undercut UC further progresses under the conductive film 19.

Figure 7A:
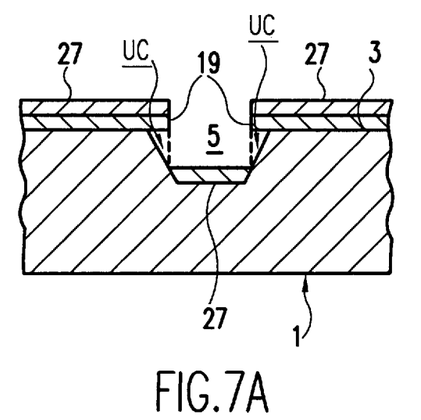
Figure 7B:
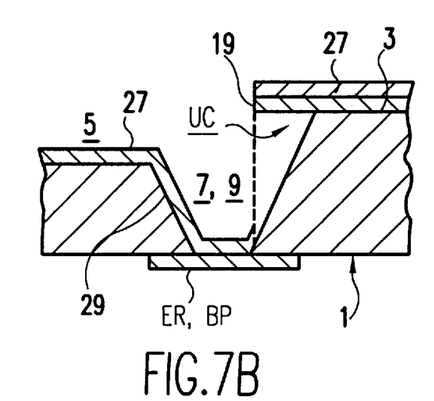

Fifth Process—FIGS. 7(a), 7(b)

In the fifth process, a conductive film 27 is again formed by depositing a conductive material on the backside surface 3 of the semiconductor chip 1 in the direction of the normal line thereto, by using the method of evaporation or sputtering. As shown in FIGS. 7(a), 7(b), the conductive film 27 is formed respectively on the upper surface of the conductive film 19, the bottom of the wiring groove 5, and the side 29 of the via-hole 7 (9) on the side of the wiring groove 5. These conductive films as deposited in the above respectively function as the ground electrode 17, the backside wiring 13, and penetration wiring 13 as shown in FIG. 2.

According to the above-mentioned method for forming the wiring structure consisting of the first through the fifth processes, the wiring structure according to the first embodiment of the invention as shown in FIG. 2 can be produced with much ease and improved efficiency.

To put it more concretely, with the deposition of the conductive material on the backside surface 3 of the semiconductor chip 1 as performed in the above fifth process, the backside wiring 13 is formed on the bottom of the wiring groove 5, and penetration wirings 15 are simultaneously formed inside the via-hole 7 (9). Furthermore, in the third process, the via-hole 7 (9) are formed by etching so as to create the undercut UC immediately under the conductive film 19. To make matters more advantageous, the conductive film 19 functions as a mask protecting the undercut UC, so that the conductive film 27 (i.e. the penetration wiring 15) formed within the via-hole 7 (9) in the fifth process, can not make any contact with the conductive films 19, 27 (i.e. the ground electrode 17) formed on the backside surface 3 of the chip 1. Similarly, in the above fourth process, the wiring groove 5 is etched to create the undercut UC immediately under the conductive film 19, and this conductive film 19 functions as a mask protecting the undercut UC, so that the conductive film 27 (i.e. the backside wiring 13) formed on the bottom of the wiring groove 5 in the fifth process can not make any contact with the conductive films 19, 27 (i.e. the ground electrode 17) formed on the backside surface 3 of the chip 1.

Furthermore, in the third process, formation of the via-hole 7 (9) is controlled in such a manner that its opening is gradually decreased as it goes on from the backside surface 3 of the semiconductor chip 1 to the front surface 11 thereof. Therefore, when the conductive film 27 is formed both on the backside surface 3 of the chip 1 and on the bottom of the wiring groove 5 in the fifth process, the conductive film 27 is also formed on the side 29 of the via-hole 7 (9) on the side of the groove wiring 5. In other words, the backside wiring 13 and the penetration wiring 15 which are connected with the circuit electrode ER and the bonding pad BP, can be formed through a single process, so that the forming the wiring structure according to the first embodiment of the invention can be realized with a small number of processes.

Second Embodiment

Figure 8A:
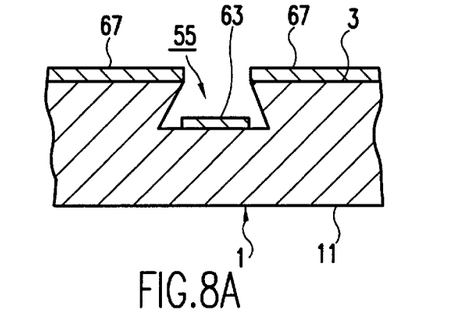
Figure 8B:
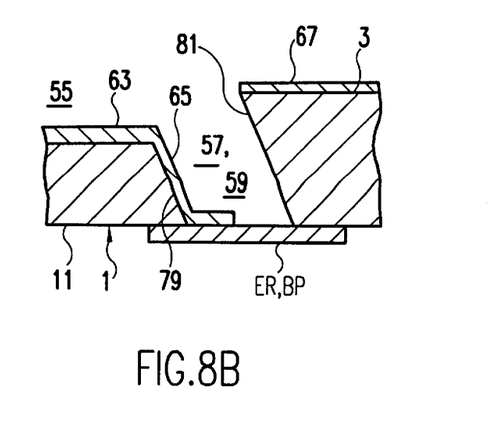

Instead of the wiring structure according to the first embodiment of the invention as shown in FIGS. 2(a) and 2(b), the wiring structure according to the second embodiment as shown in FIGS. 8(a) and 8(b) is applicable to the semiconductor chip 1 as shown in FIG. 1. In these figures, FIG. 8(a) is a sectional view taken on line a-a' of FIG. 1, and FIG. 8(b) is a sectional view taken on line b-b' of FIG. 1.

As shown in the figure, the backside surface 3 of the semiconductor chip 1 includes a wiring groove 55 and via-holes 57 (59) which are formed thereon. The wiring groove 55 is formed to have such a depth that a backside wiring 63 does not come out exceeding the backside surface 3 of the chip 1 when it is formed in the bottom of the wiring groove 55. On the other hand, the via-hole 57 (59) are formed to have such a depth that it can reach the circuit electrode ER and the bonding pad BP which are formed on the front surface 11 of the chip 1. The wiring groove 55 are formed to have a cross section in the shape of a truncated cone. The side 79 of the via-hole 57 (59) on the side of the wiring groove 55 is formed to make an angle of larger than 90° with the bottom of the wiring groove 55 while the side 81 of the via-hole 57 (59) other than the side 79 is formed to make an angle of less than 90° with the bottom of the wiring groove 55.

The circuit electrode ER and the bonding pad BP formed on the front surface 11 of the chip 1 are electrically connected with each other through the backside wiring 53 formed on the bottom of the wiring groove 55 and the penetration wirings 65 formed on the side face 79 of via-hole 57 (59).

A ground electrode 67 as a backside electrode is formed to cover all the area of backside surface 3 except the sites for forming the wiring groove 55 and the via-hole 57 (59).

Accordingly, with the wiring structure in the semiconductor chip 1 according to the second embodiment of the invention, it becomes possible in the same way as in the first embodiment to electrically connect the circuit electrode ER with the bonding pad BP with the help of the backside wiring 63 and the penetration wirings 65 which are provided on the backside surface 3 of the chip 1, thus enabling the size of the chip 1 to be decreased.

Furthermore, as the backside wiring 63 is formed on the bottom of the wiring groove 55 having a predetermined depth, it can be sufficiently insulated from the ground electrode 67 formed on the backside surface 3 of the chip 1.

Next, the method for forming the wiring structure according to the second embodiment of the invention will be described in the order of the processes for forming thereof with reference to FIGS. 9(a) through 13(b). In these figures, FIGS. 9(a), 10(a), 11(a), 12(a), and 13(a) are sectional views taken on line a-a' of FIG. 1, respectively, and FIGS. 9(b), 10 (b), 11(b), 12(b), and 13(b) are sectional views taken on line b-b' of FIG. 1, respectively.

Figure 9A:
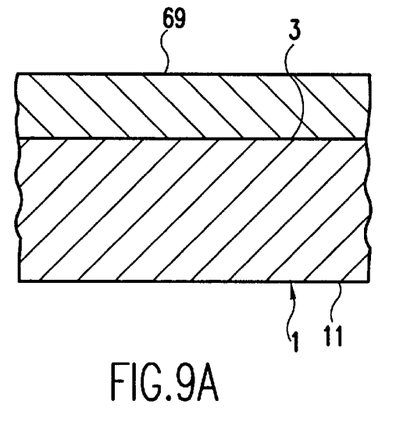
Figure 9B:
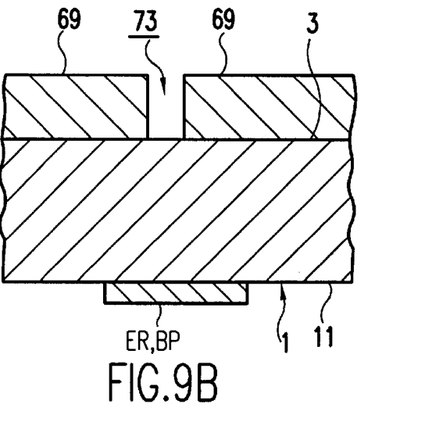

First Process—FIGS. 9(a), 9(b)

A resist film 69 is first formed to cover the backside surface 3 of the semiconductor chip 1 except areas 73 reserved for via-hole 57 (59) to be formed in the following second process. As a result, the resist film 69 has a pattern excluding those areas 73.

Figure 10A:
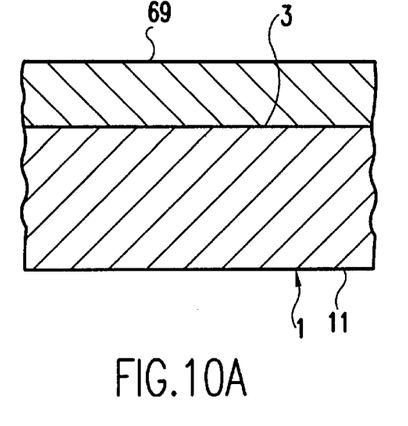
Figure 10B:
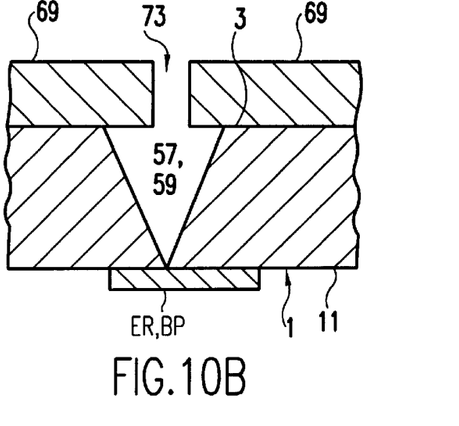

Second Process—FIGS. 10(a), 10(b)

The semiconductor chip 1 is then etched from its backside surface 3 to form the via-hole 57 (59). In this process, the resist film 69 functions as a mask against the etchant. With this etching, the via-hole 57 (59) is formed in such a manner that its opening is gradually reduced as etching progresses inside the chip 1. At this stage, it is not always necessary that the via-hole 57 (59) is etched so as to penetrate through the chip 1, because the via-hole will be again etched in the later process until it reaches the circuit electrode ER or the bonding pad BP formed on the front surface 11 of the chip 1.

Figure 11A:
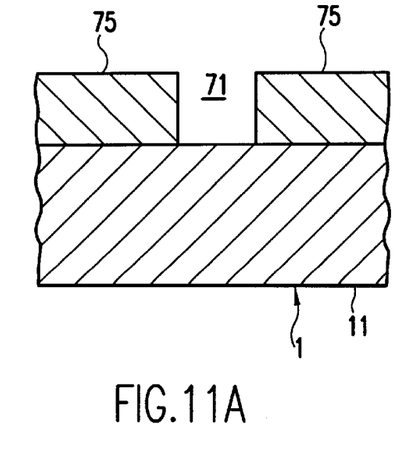
Figure 11B:
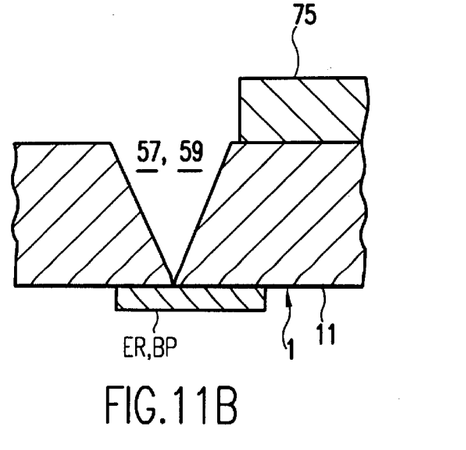

Third Process—FIGS. 11(a), 11(b)

In this process, the resist film 69 formed in the first process is removed and then, another resist film 75 is newly formed on the backside surface 3 of the semiconductor chip 1 except an area 71 reserved for a wiring groove 55 which is formed in the following fourth process, and the openings of the via-hole 57 (59) which is already formed in the second process. Thus, the resist film 75 has a pattern excluding the area 71 and the opening of the via-hole.

Figure 12A:
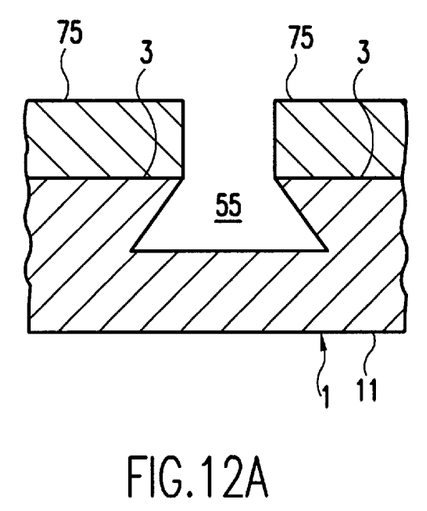
Figure 12B:
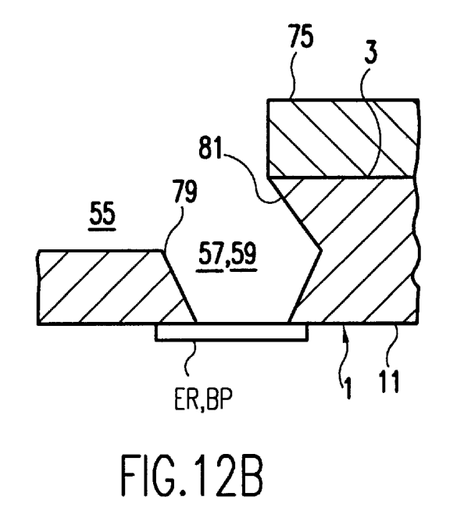

Fourth Process—FIGS. 12(a), 12(b)

Another etching as mentioned above is carried out with the help of the resist film 75 as a mask against the etchant. Through this etching process, the wiring groove 55 is formed, and at the same time, the via-hole 57 (59) formed in the second process is reformed with respect to its shape.

In this process, the wiring groove 55 is formed i.e. etched in such a manner that its cross section has a shape like a truncated cone. In other words, its opening is gradually enlarged as the etching progresses into the inside of the semiconductor chip 1. On one hand, the opening of the via-hole 57 (59) is enlarged through this etching process. Especially, in the shallow range from the backside surface 3 of the chip 1 to the bottom of the wiring groove 55, the via-hole is etched so as to have a cross section like a truncated cone shape as in the case of the wiring groove 55 while in the deeper range exceeding the bottom of the wiring groove 55, the via-hole is etched in the direction similar to that in the second process, so that the opening of the via-hole have a cross section in the shape of a truncated cone inverted upside down in that range. Consequently, the side face 79 of the via-hole 57 (59) on the side of the wiring groove 55 makes an angle of larger than 90° with the bottom of the wiring groove 55 while the side 81 of the via-hole other than the side 79 of the same makes angle of less than 90° with the backside surface 3 of the chip 1. Etching for formation of both the wiring groove 55 and the via-hole 57 (59) may be carried out by using the anisotropic dry etching method, the wet etching method using a mixed etching solution consisting of organic acid such as citric acid and hydrogen peroxide, or combination of dry and wet etching methods.
Fifth Process—FIGS. 13(*a*), 13(*b*)

Figure 13A:
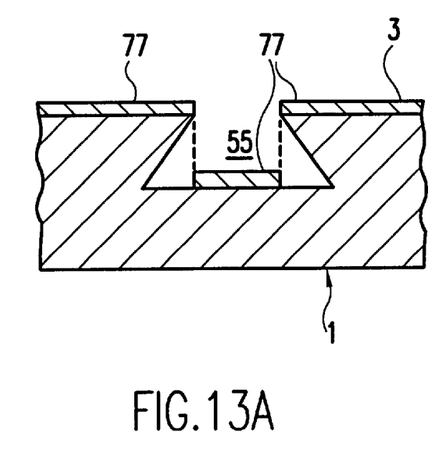
Figure 13B:
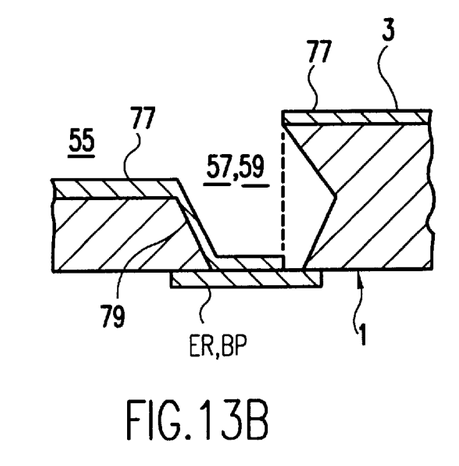

The resist film formed in the third process 75 is removed at first, and then, a conductive film 77 is formed by depositing a conductive material from the backside surface 3 of the semiconductor chip 1 in the direction of the normal line thereto, with the help of the method of evaporation or sputtering. As shown in FIGS. 13(*a*), 13(*b*), the conductive film 77 is deposited respectively on the backside surface 3 of the chip 1, the bottom of the wiring groove 55, the side 79 of via-hole 57 (59) on the side of the wiring groove 55, and the circuit electrode ER and the bonding pad BP which are exposed to the via-hole 57 (59). These conductive films as deposited function as the ground electrode 67, the backside wiring 63, and penetration wiring 65 as previously shown in FIG. 8.

With the above-mentioned method consisting of the first through the fifth processes, the wiring structure as shown in FIG. 8 can be formed with much ease and improved efficiency according to the second embodiment of the invention.

To put it more concretely, with the deposition of the conductive material on the backside surface 3 of the semiconductor chip 1 in the above fifth process, the ground electrode 67 is formed on the backside surface 3 of the chip 1. At the same time, the backside wiring 63 is formed on the bottom of the wiring groove 55, and penetration wiring 65 is formed inside the via-hole 57 (59). Furthermore, in the fourth process, etching is controlled in such a manner that the side 81 of the via-hole 57 (59) makes an angle of less than 90° with the backside surface 3 of the chip 1. The shape of this side 81 prevents the conductive film 77 i.e. the penetration wiring 65 which is formed in the via-hole 57 (59) in the fifth process, from making contact with the conductive film 77 i.e. the ground electrode 67 formed on the backside surface 3 of the chip 1. Similarly, in the fourth process, the wiring groove 55 is etched to have a cross section in the shape of the truncated cone, so that the conductive film 77 i.e. the backside wiring 63 formed on the bottom of the wiring groove 55 in the fifth process, is prevented from making any contact with the conductive film 77 i.e. the ground electrode 67 which is formed on the backside surface 3 of the chip 1.

Furthermore, in the second and fourth processes, etching is controlled in such a manner that the side 79 of the via-hole 57 (599 on the side of the wiring groove 55 makes an angle of larger than 90° with the bottom of the wiring groove 55. Consequently, with deposition of the conductive material in the fifth process, the conductive film 77 is formed both on the backside surface 3 of the chip 1 and on the bottom of the wiring groove 55, and at the same time, the conductive film 77 can be also formed on the side 79 of the via holes 57 (59) on the side of the wiring groove 55. Namely, the backside wiring 63 and the penetration wiring 65 which are to be connected with the circuit electrode ER and the bonding pad BP, can be simultaneously formed in a minimum process i.e. only in a single process. Furthermore, as the ground electrode 67 can be also formed simultaneously by the method according to the second embodiment of the invention, the number of the processes can be further reduced in comparison with that which is previously described in connection with the first embodiment.

Third Embodiment

Figure 14A:
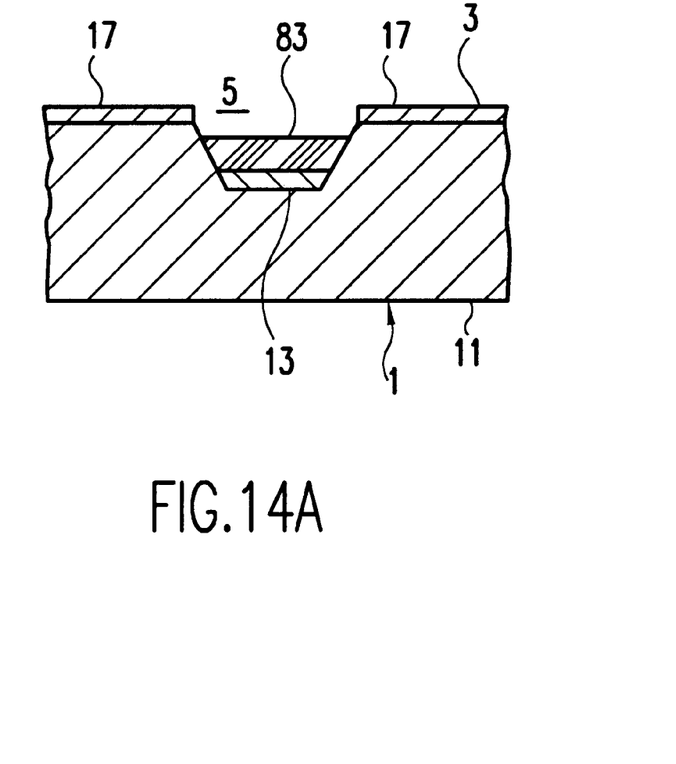
Figure 14B:
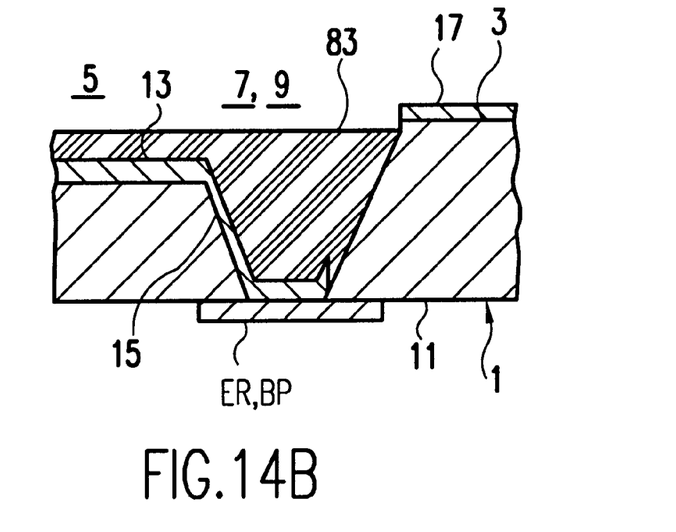

In addition, an insulating material 83 may be applicable to the wiring groove 5 and the via-hole 7 (9) in the wiring structure formed according to the first embodiment of the invention. This is shown in FIGS. 14(*a*) and 14(*b*) as the third embodiment of the invention. In these figure, FIG. 14(*a*) is a view taken on line a-a' of FIG. 1, and FIG. 14(*b*) is a view taken on line b-b' of FIG. 1.

As shown in FIGS. 14(*a*) and 14(*b*), as the insulating material 83 fills up the wiring groove 5 and the via-hole 7 (9), the backside wiring 13 and the penetration wiring 15 are not exposed to the exterior. This insulating filler brings several advantages not only to the process for assembling semiconductor elements but also to the characteristic of the same. For instance, in case of fixing the semiconductor chip 1 to a corresponding package with the help of a metallic paste, as the metallic paste can flow into neither the wiring groove 5 nor the via-hole 7 (9), any electrical short can not be caused between the ground electrode 17 formed on the backside surface 3 and the backside wiring 13 and/or the penetration wiring 15 formed on the same. Also, as the backside wiring 13 and the penetration wiring 15 are sealed by the insulating material 83, the semiconductor element can be more stabilized against change in the environmental factors. Furthermore, if the amount of the insulating material 83 to be filled is controlled to the extent that it does not jut out above the backside surface 3 of the semiconductor chip 1, the semiconductor chip 1 can be preferably fixed to its package with ease. The insulating material 83 may be selected from silicon oxide, silicon nitride, polyimide, and so forth.

The third embodiment of the invention has been described with respect to the application of the insulating material 83 to the wiring groove 5 and the via-hole 7 (9) of the wiring structure formed according to the first embodiment. However, it is apparent that the insulating material 83 is applicable to the wiring groove 55 and the via-hole 57 (59) of the wiring structure formed according to the second embodiment.

The process of filling the insulating material 83 according to this third embodiment may be incorporated into either one of the methods according to the first and second embodiments as the final process thereof.

While the invention has been described by way of certain preferred embodiments with reference to the accompanying drawings, these embodiments are not intended to place any limitation over the invention and are illustrated for the purpose of exemplification to the last. It will be understood by those skilled in the art that various changes and modifications may be made over the embodiments within the technical concept as recited in the attached claims for patent and that such changes and modifications naturally should come under the technical scope of the invention.

For instance, in the above embodiments, the via-hole is bored from the backside surface of the semiconductor chip by choosing the area thereon so as to meet the formation areas for the circuit electrode and the bonding pad on the front surface of the chip. However, the invention is not limited by these embodiments. The invention is applicable to the case where the via-hole is formed regardless of the formation areas of the circuit electrode and the bonding pad, and they are connected together by means of separate wirings provided on the front surface of the semiconductor element.

According to the invention recited in the attached claims 1 through 5, the backside surface of the semiconductor chip is effectively utilized for wiring, so that not only the width of the wire can be widened if needed, but also the wiring density per wiring pattern can be increased, thereby enabling the entire dimension of the semiconductor chip to be reduced.

Furthermore, according to the invention recited in the attached claims 6 through 8, the wiring structure as recited in claims 1 through 8 can be formed with ease and improved efficiency.

The entire disclosure of Japanese Patent Application No. 9-189184 filed on Jun. 30, 1997 including specification, claims, drawings and summary is incorporated herein by reference in its entirety.

What is claimed is:

1. A wiring structure for a semiconductor element comprising:
   a circuit electrode led from an electric circuit formed on a semiconductor chip, said circuit electrode being formed on a front surface of the semiconductor chip;
   a bonding pad which is electrically connected with said circuit electrode;
   a wiring groove which is formed on a backside surface of said semiconductor chip and which has a cross section in the shape of a truncated cone having an opening which is gradually enlarged as it goes from the backside surface of the semiconductor chip toward an inside of said semiconductor chip;
   a backside wiring which is formed on a bottom of said wiring groove;
   a via-hole which is formed to penetrate through both said front surface of the semiconductor chip and the bottom of said wiring groove; and
   a penetration wiring which electrically connects said backside wiring with said circuit electrode and said bonding pad through and said via-hole.

2. A wiring structure as claimed in claim 1, wherein the bottom of said wiring groove makes an angle of larger than 90° with a side wall of said via-hole, on which said penetration wiring is disposed.

3. A wiring structure as claimed in claim 1, wherein at least an externally exposed portion of said backside wiring disposed in said wiring groove, and of said penetration wiring passing through said via-hole, are covered by an insulating material.

4. A wiring structure as claimed in claim 1, wherein said via-hole is formed in an area for forming said circuit electrode on the front surface of said semiconductor chip.

5. A wiring structure as claimed in claim 1, wherein said via-hole is formed in an area for forming said bonding pad on the front surface of said semiconductor chip.

6. A wiring structure for a semiconductor element comprising:
   a circuit electrode led from an electric circuit formed on a front surface of a semiconductor chip;
   a bonding pad;
   a wiring groove which is formed on a backside surface of said semiconductor chip and which has a cross section in a shape of a truncated cone having an opening which is gradually enlarged as it goes from the backside surface of said semiconductor chip toward an inside of said semiconductor chip;
   a first via-hole which is formed to penetrate through both said front surface of the semiconductor chip and a bottom of said wiring groove;
   a second via-hole which is formed to penetrate through both said front surface of the semiconductor chip and the bottom of said wiring groove;
   a backside wiring which is formed on the bottom of said wiring groove;
   a first penetration wiring which electrically connects said backside wiring with said circuit electrode through said first via-hole; and
   a second penetration wiring which electrically connects said backside wiring with said bonding pad through said second via-hole, wherein at least an externally exposed portion of said backside wiring disposed in said wiring groove, and said first and second penetration wirings are each covered by an insulating material.

7. A wiring structure as claimed in claim 6, wherein the bottom of said wiring groove makes an angle of larger than 90 degrees with a side wall of each of said first and second via-holes, on which said first and second penetration wirings are disposed.

8. The wiring structure of claim 6, wherein the backside wiring is formed exclusively on the bottom of said wiring groove.

9. A wiring structure for a semiconductor element comprising:
   a circuit electrode led from an electric circuit formed on a front surface of a semiconductor chip;
   a bonding pad formed on the front surface of the semiconductor chip;
   a wiring groove which is formed on a backside surface of said semiconductor chip and which has a cross section in a shape of a truncated cone having an opening which is gradually enlarged as it goes from the backside surface of said semiconductor chip toward an inside of said semiconductor chip;
   a backside wiring which is formed on the bottom of said wiring groove;
   a first via-hole which is formed to penetrate through both said front surface of the semiconductor chip and a bottom of said wiring groove;
   a second via-hole which is formed to penetrate through both said front surface of the semiconductor chip and the bottom of said wiring groove;
   a first penetration wiring which electrically connects said backside wiring with said circuit electrode through said first via-hole; and
   a second penetration wiring which electrically connects said backside wiring with said bonding pad through said second via-hole, wherein said first and second penetration wirings and said backside wiring connect said circuit electrode with said bonding pad.

10. A wiring structure as claimed in claim 9, wherein the bottom of said wiring groove makes an angle of larger than 90 degrees with a side wall of each of said first and second via-holes, on which said first and second penetration wiring are disposed.

11. A wiring structure as claimed in claim 9, wherein at least an externally exposed portion of said backside wiring disposed in said wiring groove, and of said first and second penetration wirings passing through said first and second via-holes, are covered by an insulating material.

12. The wiring structure of claim 9, wherein the backside wiring is formed exclusively on the bottom of said wiring groove.

* * * * *